United States Patent [19]
Whittaker

[11] Patent Number: 5,969,926
[45] Date of Patent: Oct. 19, 1999

[54] SHORT CIRCUIT PROTECTION ARRANGEMENT FOR AN OUTPUT BUFFER OF AN INTEGRATED CIRCUIT

[75] Inventor: Edward John Wemyss Whittaker, Bishop's Stortford, United Kingdom

[73] Assignee: Northern Telecom Limited, Montreal, Canada

[21] Appl. No.: 08/820,620

[22] Filed: Mar. 19, 1997

[51] Int. Cl.$^6$ .................................................. H02H 3/00
[52] U.S. Cl. .............................................. 361/101; 361/98
[58] Field of Search .................................. 361/18, 93, 98, 361/100, 101, 54, 57, 93.9; 326/82, 83, 84, 85

[56] References Cited

U.S. PATENT DOCUMENTS 4,884,165  11/1989  Kong et al. .............................. 361/101
5,256,914  10/1993  Boomer ...................................... 326/29

Primary Examiner—Jeffrey Gaffin
Assistant Examiner—Kim Huynh
Attorney, Agent, or Firm—Lee, Mann, Smith, McWilliams, Sweeney & Ohlson

[57] ABSTRACT

The current flowing in an output field effect transistor is sensed by a parallel circuit arrangement which derives a sensed current representing the current flowing in the output transistor. The parallel circuit arrangement comprises series-connected CMOS transistors which are connected together in order to derive a current output which is representative of the load current through the output transistor. In a short circuit protected output buffer, the sensed current is compared with a reference current and if it exceeds the reference current the amplitude of the drive signal to the output transistor is reduced.

10 Claims, 3 Drawing Sheets

SHORT CIRCUIT PROTECTION ARRANGEMENT FOR AN OUTPUT BUFFER OF AN INTEGRATED CIRCUIT

BACKGROUND OF THE INVENTION

The present invention relates to a circuit arrangement for sensing the current flowing in an output transistor to enable the output transistor to be protected against a short circuit.

The need to protect output transistors from short circuits on their load side is well known and there have been a number of different proposals for monitoring the current flowing in an output transistor in order to provide short circuit protection. Most of these prior proposals have required the insertion of a sensing element in series with the output transistor but this solution is not efficient and can result in the need for substantial heat dissipation. Alternative active techniques have been used to shunt current away from the base of an output transistor to limit output current in the event of a large transient short circuit current.

For extended electrical overload resulting from a prolonged short circuit condition at the output, thermal sensing has been used. A disadvantage of the thermal shut-down short circuit protection is the slow response time.

A further active technique is disclosed in U.S. Pat. No. 5,256,914 where the output of an integrated circuit device is monitored in order to detect occurrence of a short circuit condition. This is accomplished by sensing and comparing the respective states of signals at the input and output of the integrated circuit device. The occurrence of an out of state condition between the input and output indicates a short circuit condition.

SUMMARY OF THE INVENTION

It is an object of the present invention to protect the output stage of an integrated circuit by preventing excessive continuous current flow and thereby protect the output transistor or transistors from damage.

It is a further object of the present invention that no reduction in speed or "on" resistance of the output transistor occurs due to the presence of the short circuit protection.

The present invention provides an output stage of an integrated circuit comprising a first path formed by first and second field effect transistors connected in series across supply rails, the junction between the first and second transistors constituting the output terminal of the stage;

a source of drive signals, the first field effect transistor having a gate terminal connected to the source of drive signals; and a monitoring circuit or second path parallel to the first path and comprising third and fourth series connected field effect transistors, the source of the second transistor being connected to the source of the first transistor, the gate of the third transistor being connected to the gate of the first transistor and the gate of the fourth transistor being connected to the gate of the second transistor with the drain of the fourth transistor forming a sensor output from the circuit.

Preferably all the transistors are of the same channel-type and the second transistor is connected as a diode in order to set the potential at the junction between the first and second transistors and hence the balance point between the first and third transistors.

Further, the third transistor may be constructed alongside the first transistor and may be realised as a section of the first transistor but with its drain separately connected. The first and third transistors preferably have identical channel lengths but the channel of the first transistor is desirably considerably wider than that of the third transistor. The width of the channel of the third transistor is determined by the ratiometric accuracy between the first and third transistors, as desired and is normally only a fraction of that of the first transistor.

A fifth transistor is preferably connected in series with the sensor output from the circuit arrangement in the case where the fourth transistor does not have an infinite output impedance. In order to compensate for the presence of this fifth transistor, a sixth transistor is connected in the series between the second transistor and the current rail in order to further guarantee that the ratio of currents in the two paths is accurately known.

A sensor circuit of the type described above can be used in a short circuit protected output buffer where the output of the sensor circuit is used to form one input to a comparison circuit whose other input is fed with a reference current indicative of the maximum output current from the first transistor. Should the sensor output indicate that the current flowing through the first transistor is too great ie a short circuit condition, then the comparison circuit can be used to reduce the magnitude of the output of the source of signals in order to keep the output transistor within specified limits.

With this arrangement, large transient currents can still be fed to the load, eg when charging a compacitive load, but long term overload is prevented.

BRIEF DESCRIPTION OF THE DRAWINGS

In order that the present invention be more readily understood, embodiments thereof will now be described by way of example with reference to the accompanying drawings, in which.

DESCRIPTION OF THE PREFERRED EMBODIMENTS

The basic underlying principle of operation of the present invention is that current flowing in the output transistor will be sensed by a parallel circuit arrangement which will derive a sensed current representative of the current flowing in the output transistor. The sensed current will then be compared with a current reference and if the reference signal is exceeded the drive signal to the output transistor will be reduced.

Figure 1:
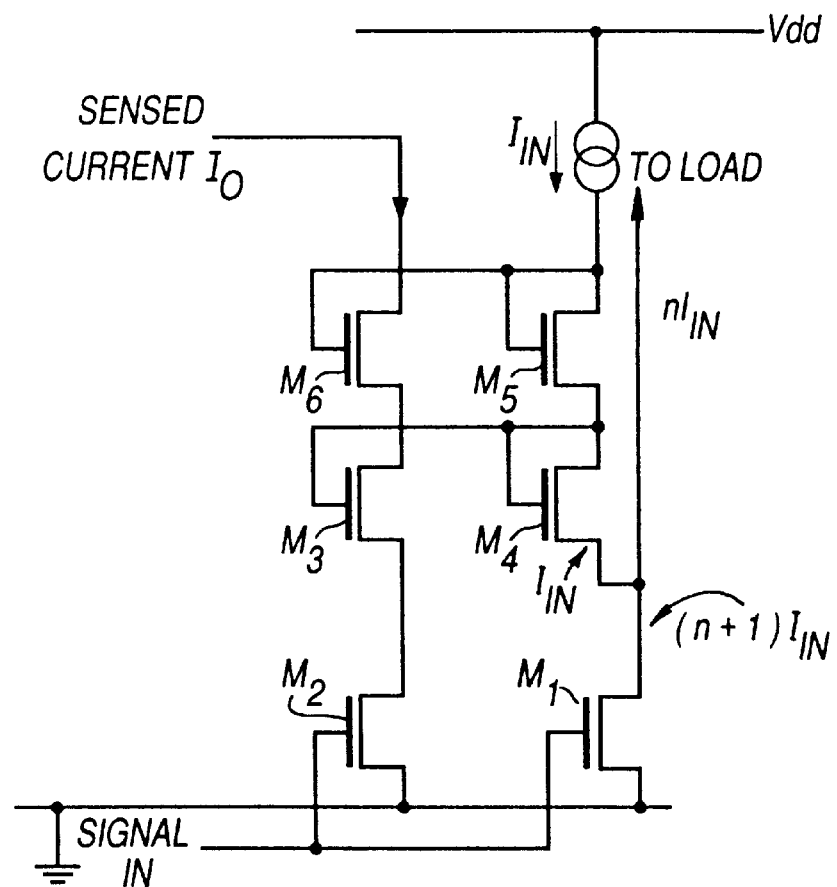
FIG. 1 shows a circuit diagram of an output stage of an integrated circuit according to the present invention.

Turning to FIG. 1, this shows the arrangement for sensing the current flowing in an output transistor of an integrated circuit device constructed using CMOS technology. An output transistor M1 has its source terminal connected to ground and its drain terminal forms the output terminal of the device. The drain terminal is also connected to a series circuit formed by a second transistor M4 and a further transistor M5. The transistors M4 and M5 are connected as diodes and the drain of the further transistor M5 is connected to the Vdd rail via a constant current source $I_{in}$.

In order to sense current flow through the first transistor M1, two further transistors, M2 and M3 are connected across the transistors M1 and M4 such that the source of the transistor M2 is connected to the source of the first transistor M1, the gate of the transistor M2 is connected to the gate of the transistor M1 and to the source of signals to be fed to the load, and the gate of the transistor M3 is connected to the gate of the transistor M4. The transistor M2 is preferably constructed alongside transistor M1 on the same substrate and is realised as a section of M1 but it will be appreciated that its drain is separately connected. The transistors M1 and M2 have identical channel lengths but it is desirable for the channel width of M1 to be considerably wider than the channel width of the transistor M2. The channel width of the transistor M2 is sufficiently wide that the required ratiometric accuracy between transistors M1 and M2 is achieved.

The transistors M3 and M4 are identical short channel devices. With this arrangement, in normal operation, a signal applied to the gate of transistor M1 will result in a current flow equal to $I_{load}$ plus $I_{in}$. This current flow through the transistor M1 produces a voltage drop $\Delta V$ and this voltage drop will become large in the presence of a short circuit. As $\Delta V$ increases in the presence of a short circuit, the diode formed by the transistor M4 is pulled up and due to the connection to the transistor M3, the transistor M2 draws more and more current.

Further transistors M5 and M6 are connected in series in their respective circuits and M6 is used as a cascode to M3 due to the fact that the transistor M3 does not have an infinite output impedance. Transistors M5 and M6 are identical in order to further guarantee that the ratio of currents in the two current paths is accurately known.

FIG. 1 shows all the transistors to be of the same type of CMOS, in this case N-channel transistors. The transistors can be changed for P-channel devices if desired but this would require the polarity of the rails to be altered.

Figure 2:
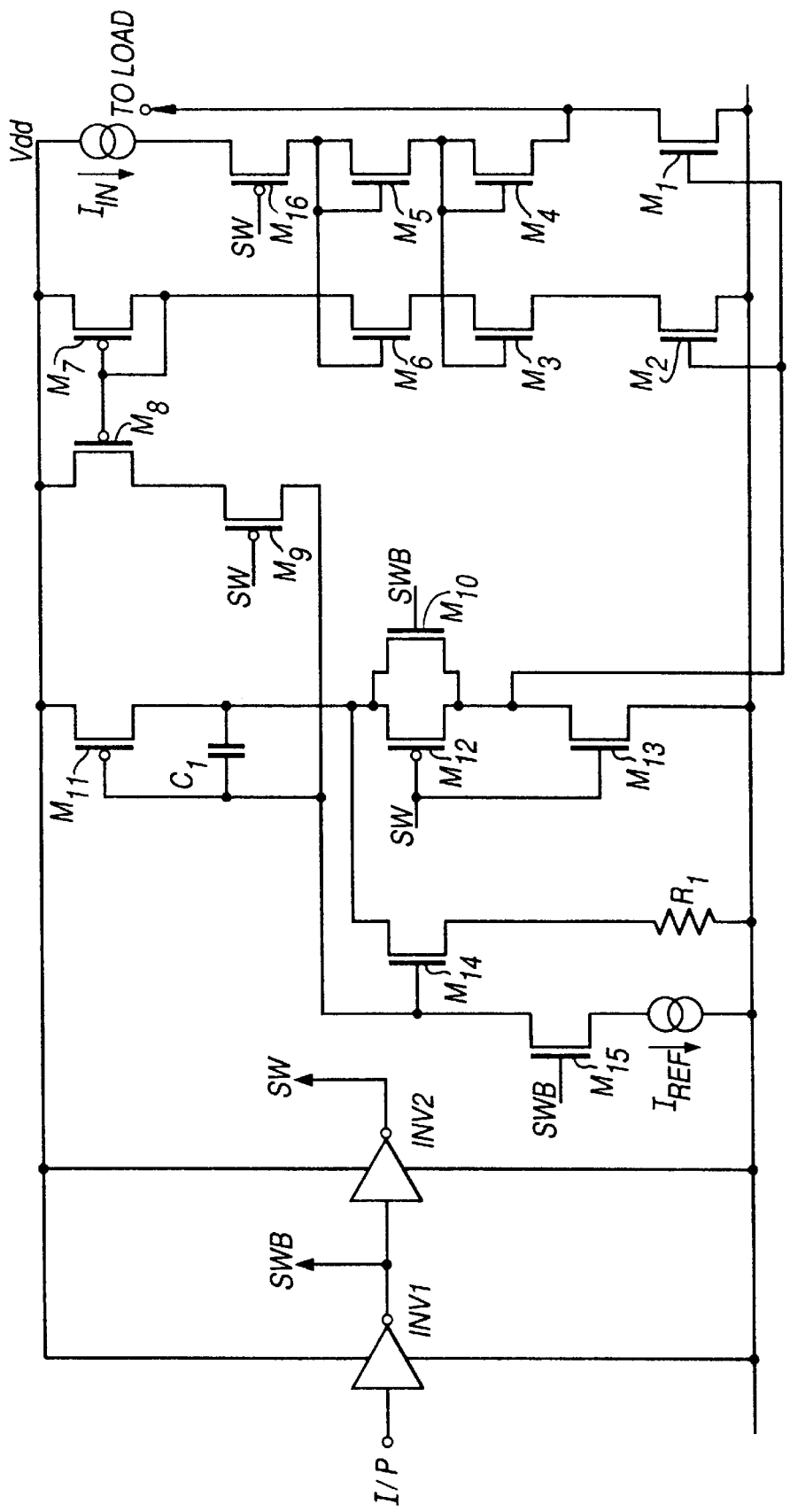
FIG. 2 shows a circuit diagram of a complete short circuit protected driver circuit according to the present invention.

FIG. 2 shows how the circuit shown in FIG. 1 may be incorporated into a complete output buffer with short circuit protection. In normal operation, an input signal to be fed to a load is passed through CMOS inverters INV1 and INV2 increasing the magnitude of the drive signal at each stage. The output of the inverter INV2 is fed to a CMOS inverter formed by P-channel transistor M12 and N-channel transistor M13 which in turn feeds the gates of the transistors M1 and M2. The transistor M12 is connected to the positive supply Vdd via a P-channel transistor M11.

If it is assumed that the current in the output transistor M1 is below the maximum allowed value, the gate of transistor M11 is held low and thus its drain is set to Vdd. As discussed in relation to FIG. 1, if the current in transistor M1 rises, this causes an increase in current in transistor M6 which is mirrored by a mirror circuit formed by P-channel transistors M7 and M8 and compared with a reference current $I_{REF}$ at the gate of the transistor M11. If the current mirrored by the transistors M7 and M8 exceeds the reference current $I_{REF}$ then the potential at the gate of transistor M11 starts to rise, increasing the "on" resistance of the transistor M11 and activating N-channel transistor M14 whose gate is connected to the junction between $I_{REF}$ and the current output from the mirror circuit formed by the transistors M7 and M8. Activating transistor M14 whose source terminal is connected via a resistance R1 to the ground rail causes the transistor M14 to act as a pull-down device causing the potential to the drain of the transistor M11 to fall. Since M11 supplies current to the inverter circuit formed by the transistors M12 and M13, a reduction in the drain potential of M11 causes a consequent reduction in the amplitude of the output from the inverter circuit and hence a reduction in the drive current to the gates of the transistors M1 and M2. The reduction in drive to the gates of transistors M1 and M2 reduces the current in M1.

A capacitor C1 connected between the gate and source of the transistor M11 provides a dominant pole to stabilise the loop and to provide a momentary high current drive capacity which is required when driving capacitive loads by delaying the onset of current limiting.

The above described basic operation of the short circuit protection can be improved by the inclusion of switches in the form of a P-channel transistor M9 in the source circuit of the mirror transistor M8, an N-channel transistor M15 between the reference source $I_{REF}$ and the gate of the transistor M14 and a P-channel transistor M16 between the voltage rail Vdd and the drain of the transistor M5 in the output circuit. These switches are arranged to connect the current sources and the feedback mechanism only whilst drive is applied to the output transistor M1 thereby leaving the circuit with a short term "memory" of a short circuit whilst the drive to M1 is not required. This also has the effect of making a small saving in power dissipation.

Further, an N-channel transistor M10 may be provided in parallel with the P-channel transistor M12 but whose gate is connected to the output of the inverter INV1 in order to ensure that for those occasions when the drive to the transistors M1 and M2 has been so reduced by the short circuit mechanism that transistor M12 barely reaches its threshold. Were this to happen, the effect would be to introduce another pole with the gate capacitance of transistor M1 in the control circuit thereby risking instability. Under this condition, the transistor M10 provides a low impedance path ensuring proper operation.

As a further modification a small leakage "pull down" current may be added to the gate of the transistor M14 so that in the event of a very long period without a negative going pulse, the first negative pulse after is given full drive capability.

Figure 3:
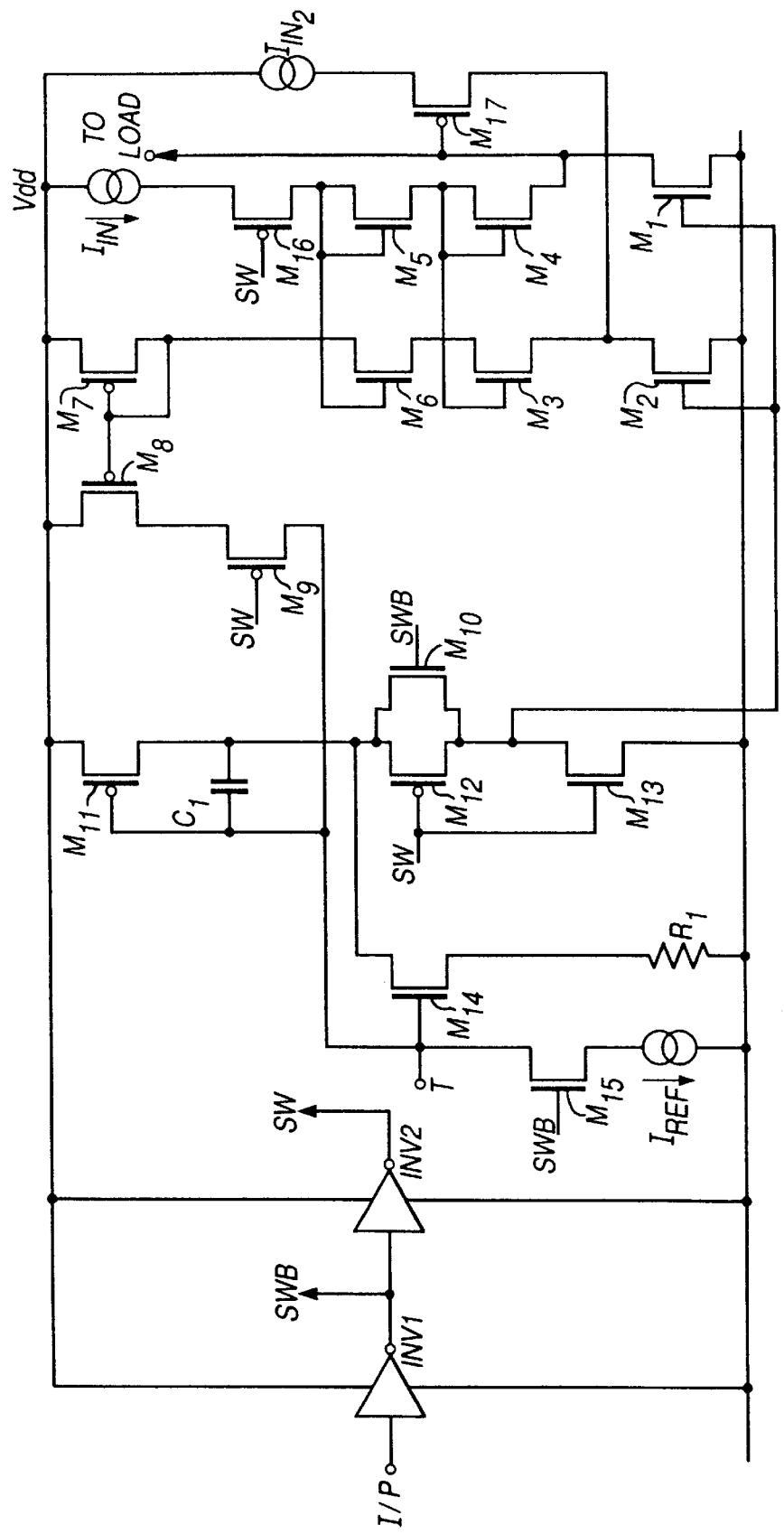
FIG. 3 shows a modification to the circuit shown in FIG. 2.

Referring now to FIG. 3, this shows a circuit which is by and large identical to the circuit shown in FIG. 2 and consequently its operation will not be described in detail. The difference between the circuit shown in FIG. 2 and that shown in FIG. 3 is that the load is supplied from the output transistor M1 via a fold back current limit transistor M17 whose source is connected to the drain of the transistor M2 and whose gate is connected to the drain of the transistor M1. The drain of the transistor M17 is supplied from Vdd. In operation, the additional transistor M17 draws additional current out of transistor M2 when the potential on the drain of transistor M1 is low thereby increasing the drive current available for small voltage drops across the transistor M1 and limiting heat dissipation in transistor M1 when it is shorted to Vdd, for example.

FIG. 3 also shows a further modification which may be incorporated into the buffer with or without the fold back current features. The further modification is a facility to monitor the operation of the short circuit protection, ie to know when the short circuit protection is in operation. This is achieved by providing a status output terminal T connected to the gate of the transistor M14. By monitoring the voltage on the terminal T the tact that the short circuit protection has operated can be determined by external equipment which can flag the fact for fault finding purposes.

As will be understood from the foregoing description the present invention provides a short circuit protected output buffer which requires no series sensing element. It can be constructed using CMOS techniques and can be used as a digital data switch handling high speed data including 2M bits/sec and above.

It will be appreciated that various modifications may be made. Thus while an NMOS output stage has been described, it is possible to change that to a PMOS output stage by changing NMOS for PMOS and visa versa for the transistors used in FIG. 2 and changing the polarity of the power rails.

Other variations and modifications of the specific embodiments herein shown and described will be apparent to those skilled in the art, all within the intended spirit and scope of the invention. While the invention has been shown and described with respect to particular embodiments thereof, these are for the purpose of illustration rather than limitation. Accordingly, the patent is not to be limited in scope and effect to the specific embodiments herein shown and described nor in any other way this is inconsistent with the extent to which the progress in the art has been advanced by the invention.

What is claimed is:

1. An output stage of an integrated circuit comprising supply and ground rails, a first current path between said rails, the first current path including first and second field effect transistors connected in series, a junction between the first and second transistors constituting a sole output terminal of the output stage;

a monitoring circuit in the form of a second current path between said supply and ground rails, the second current path including third and fourth field effect transistors connected in series; wherein the monitoring circuit monitors the output of the sole output terminal in order to maintain the output within specified limits;

a source of drive signals;

the first and third field effect transistors having a respective gate terminal connected to the source of drive signals; and connections between the first and second current paths through which the current flowing in the second current path corresponds to current flowing in the first current path in response to drive signals, and there is no direct connection between said second current path and the sole output terminal.

2. An output stage according to claim 1 wherein the third transistor is constructed so as to conduct a current corresponding to a fraction of the current flowing in the first transistor.

3. An output stage according to claim 1, wherein the second transistor is connected as a diode in order to set the potential at the junction between the first and second transistors, a terminal of the second transistor being connected to a gate terminal of the fourth transistor.

4. An output stage according to claim 1, wherein a further transistor is included in the second current path in series with the fourth transistor, and a matching transistor is included in the first current path in series with the second transistor.

5. A short circuit protected output buffer comprising an output stage including supply and ground rails, a first current path between said supply and ground rails, the first current path including first and second field effect transistors connected in series, a junction between the first and second transistors constituting a sole output terminal of the output stage;

a monitoring circuit in the form of a second current path between said supply and ground rails, the second current path including third and fourth field effect transistors connected in series;

a source of drive signals;

the first and third field effect transistors having a respective gate terminal connected to the source of drive signals; and connections between the first and second current paths whereby current flowing in the second current path corresponds to current flowing in the first current path, and there is no direct connection between said second current path and the sole output terminal;

a source of reference current;

a comparison means having first and second inputs, the first input being connected to said monitoring circuit and the second input being connected to the source of reference current, and having an output terminal;

an analogue control device connected to the output of the comparison means and to the source of drive signals for controlling the output of said source of drive signals in response to signals from the comparison means to reduce the magnitude of the output of the source of drive signals in order to keep the current flowing in the first transistor within specified limits.

6. A short circuit protected output buffer according to claim 5, wherein the third transistor is constructed so as to conduct only a fraction of the current flowing in the first transistor.

7. A short circuit protected output buffer according to claim 5, wherein the second transistor is connected as a diode in order to set the potential at the junction between the first and second transistors, a gate terminal of the second transistor being connected to a gate terminal of the fourth transistor.

8. A short circuit protected output buffer according to claim 5, wherein a further transistor is included in the second current path in series with the fourth transistor and a matching transistor is included in the first current path in series with the second transistor.

9. A short circuit protected output buffer according to claim 5, wherein the comparison means is in the form of a transistor whose gate terminal is connected to the output from the second current path and to the source of reference current.

10. A short circuit protected output buffer according to claim 9, wherein the control device is in the form of a further transistor whose drain-source current path is in series with the drain-source current path of the transistor forming the comparison means and whose gate terminal is connected to the gate terminal of said transistor forming the comparison means whereby to reduce the supply to the source of drive signals.

* * * * *